(12) United States Patent
Kasumi

(10) Patent No.: US 7,248,335 B2
(45) Date of Patent: Jul. 24, 2007

(54) EXPOSURE APPARATUS, DEVICE MANUFACTURING METHOD, STAGE APPARATUS, AND ALIGNMENT METHOD

(75) Inventor: Kazuyuki Kasumi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/377,282

(22) Filed: Mar. 17, 2006

(65) Prior Publication Data
US 2006/0158630 A1 Jul. 20, 2006

Related U.S. Application Data

(62) Division of application No. 10/864,474, filed on Jun. 10, 2004, now Pat. No. 7,027,127.

(30) Foreign Application Priority Data
Jun. 19, 2003 (JP) .............................. 2003-175237

(51) Int. Cl.
 *G03B 27/42* (2006.01)
(52) U.S. Cl. .............................. 355/53; 355/72; 355/67
(58) Field of Classification Search .................. 355/53, 355/67, 72, 75; 378/34, 35; 250/492.1, 250/492.2
See application file for complete search history.

(56) References Cited

U.S. PATENT DOCUMENTS

| 5,142,156 | A | | 8/1992 | Ozawa et al. ............... 250/548 |
| 5,671,057 | A | * | 9/1997 | Kawai ........................ 356/399 |
| 5,835,560 | A | | 11/1998 | Amemiya et al. ............ 378/34 |
| 5,978,069 | A | | 11/1999 | Kato ............................ 355/53 |
| 6,381,005 | B1 | | 4/2002 | Kasumi et al. ............... 355/75 |
| 6,754,303 | B2 | | 6/2004 | Kasumi ....................... 378/34 |
| 2004/0004701 | A1 | | 1/2004 | Kasumi ....................... 355/53 |
| 2004/0021866 | A1 | * | 2/2004 | Watts et al. ................ 356/401 |

FOREIGN PATENT DOCUMENTS

JP 2829642 9/1998

* cited by examiner

*Primary Examiner*—D. Rutledge
(74) *Attorney, Agent, or Firm*—Fitzpatrick, Cella, Harper & Scinto

(57) ABSTRACT

An exposure apparatus for exposing a substrate to a pattern due to an original includes a substrate stage which holds and moves the substrate, and a first measurement unit which is arranged on the substrate stage, and measures a position of a mark formed on the original by projecting and receiving light.

2 Claims, 11 Drawing Sheets

EXPOSURE APPARATUS, DEVICE MANUFACTURING METHOD, STAGE APPARATUS, AND ALIGNMENT METHOD

This application is a divisional application of U.S. patent application Ser. No. 10/864,474, filed Jun. 10, 2004 now U.S. Pat. No. 7,027,127.

FIELD OF THE INVENTION

The present invention relates to an alignment technique which is used for manufacturing various devices, for example, semiconductor chips such as ICs and LSIs, display elements such as liquid crystal panels, detection elements such as magnetic heads, or image sensing elements such as CCDs.

BACKGROUND OF THE INVENTION

Along with a recent increase in density and speed of semiconductor integrated circuits, the pattern line width of the integrated circuits is decreasing, and higher performance has been demanded for semiconductor manufacturing methods. Accordingly, for exposure apparatuses used for forming a resist pattern in lithography in the semiconductor manufacturing step, there have also been developed steppers using extreme ultraviolet light such as KrF laser (248 nm), ArF laser (193 nm), and $F_2$ laser (157 nm), and exposure light such as X-rays (0.2 to 1.5 nm) having a wavelength shorter than a conventional one.

In exposure using X-rays, a proximity exposure method of moving an X-ray mask having a desired pattern to be close to a resist-coated wafer, and irradiating the wafer with X-rays through the X-ray mask, thereby transferring the projected image of the mask pattern onto the wafer, has been developed.

In order to obtain high-intensity X-rays, an exposure method using synchrotron radiation is proposed. The technique has been reported that a pattern of 100 nm or less can be transferred. A synchrotron radiation source requires large-scale facilities. A profit cannot be expected unless device fabrication is performed by connecting ten or more exposure apparatuses to one light source. Hence, an exposure apparatus using a synchrotron radiation source is a system that is suitable for application to a highly demanded device such as a semiconductor memory.

In recent years, a device using GaAs has been input into practical use as a communication device, and a large decrease in line width is required. Communication devices are produced in an amount less than that of semiconductor memories, and many types of communication devices are produced in small amounts. When an X-ray exposure system using synchrotron radiation as the light source is introduced to the fabrication of communication devices, it will probably make no profit. Hence, the exposure apparatus which is suitable for application to produce devices (not limited to the communication devices) in small amounts, and can transfer a micropattern at low cost is expected to be developed. To meet this demand, an exposure apparatus using a compact X-ray source which generates high-intensity X-rays is developed and used in actual communication device production. The light source ranges from one which is called a laser plasma beam source and generates a plasma by irradiating a target with a laser beam and uses X-rays generated by the plasma, to one which generates X-rays by generating a pinch plasma in a gas. These light sources are called point sources.

According to a general arrangement, one exposure apparatus which transfers a pattern by aligning a mask and wafer is connected to one point source.

The proximity X-ray exposure is different from reduction projection exposure for reducing the size of the image of a transfer master (mask), and forming a reduced image on a target substrate (wafer) by using an optical system. The proximity X-ray exposure is a method of irradiating the wafer with the exposure light in the state of holding a transfer master (mask) and target substrate (wafer) via a small gap in parallel to transfer the pattern. The circuit pattern on the mask is transferred at x1. Since the alignment accuracy of the mask directly becomes the overlay accuracy of the circuit pattern, high-precision mask alignment is required. Hence, in the proximity X-ray exposure, the mask is aligned to a wafer stage coordinate system.

A conventional mask alignment system is disclosed in Japanese Patent No. 2,829,642, and the arrangement of the apparatus is shown in FIG. 7. A main body frame 51 includes a mask alignment scope 11 which executes an alignment measurement, a mask stage 41 which aligns a mask 20 in a rotational direction, and a wafer stage 31 which aligns the position and posture of a wafer 30, and moves step by step for each exposure processing. The mask alignment scopes 11 are mounted on respective 2-axis stages 501, and can move in X and Y directions. Reference numeral 33 denotes a laser interferometer beam for precisely controlling the position of the wafer stage 31. Reference numeral 502 denotes alignment light; and 503, reference mark table on which reference marks of the wafer stage are formed.

FIG. 8 shows an arrangement of the alignment portion in which four mask alignment scopes 11a, 11b, 11c, and 11d are arranged. A relative distance between each of mask-side alignment marks 504 formed on the mask 20 and each of wafer-side alignment marks 505 formed on the wafer 30 is measured by using alignment light 502. In this arrangement, the mask alignment scopes denoted by reference symbols a and b measure positions in the X direction, and that denoted by reference symbols c and d measure positions in the Y direction. On the basis of the mask alignment scope measurement results, the position of the wafer relative to the mask is calculated, thereby aligning the wafer.

In the above arrangement, a means for aligning the mask will be described with reference to FIGS. 9A and 9B.

FIG. 9A shows the state of the apparatus in which only the mask 20 is arranged, and FIG. 9B shows the state of the apparatus in which the mask has aligned for the stage coordinate system at the rotational position. Four mask alignment marks 105a to 105d are formed on a membrane on the mask 20. The mask alignment marks 105a and 105b are used for measuring positions in the X direction, and the mask alignment marks 105c and 105d are used for measuring positions in the Y direction. The mask alignment scopes 11a, 11b, 11c, and 11d move to the respective mark positions. Every time each of the mask alignment marks is measured, the reference mark formed on the wafer stage moves directly under (not shown) each of the mask alignment marks to detect the position of the mask alignment mark 105 relative to the reference mark. The rotation and position (each of the positions in the X and Y directions) of the mask relative to the wafer coordinate system are measured on the basis of the measurement results of two points in the X direction and those in the Y direction. On the basis of the measurement results, the mask stage is driven to align the rotational position to the wafer coordinate system. Since the mask stage 41 can be driven only about the center of the mask as a rotation axis, the shift of the position (each of the positions in the X and Y directions) of the mask relative to the stage coordinate system cannot be corrected. However, the measurement result is reflected as a correction amount in aligning the wafer stage.

The dotted lines in FIG. 9B represent the positions of the mask alignment scopes 11a, 11b, 11c, and 11d before alignment. The mask alignment scopes are mounted on the respective 2-axis stages 501 in order to move to the respective mask alignment mark positions. At least three mask alignment scopes are required to calculate the mask rotational position, and at least three 2-axis stages are required as well.

However, in the above-described technique, the mask alignment marks, mask alignment scopes, and reference marks need be aligned in mask alignment. Also, along with driving the mask stage, the wafer stage (reference mark) and four (at least three) mask alignment scopes need to move in alignment. In the alignment measurement, an error of the measurement result may occur in accordance with the position of the mask relative to each of the mask alignment scopes. However, the mask alignment scope and mask stage are on different coordinate systems, and are moved by respective positional measurement systems. Thus, when the mask is aligned or the like, even if the mask alignment scope and mask stage move to the same position, the relative positions of the mask alignment mark and the mask alignment scope may be different. Therefore, the error of the alignment measurement result occurs, and the precision of the mask alignment is decreased.

Since the mask rotational position is detected by dividing the positional difference between the two separated marks by the distance, the distance between the two marks is preferably large. However, since the marks need to be arranged in the membrane to measure the alignment, a sufficient distance between the two marks cannot be ensured.

Also, in this arrangement, the mask alignment scope measures the mask position through the mask stage and a masking blade. Hence, the distance (working distance) between the scope and mask becomes large, and the mask alignment scope also becomes large. Further, the mask stage, masking blade, and stage for aligning the mask alignment scope are crowded around the exposure position, impairing maintenability of the apparatus.

SUMMARY OF THE INVENTION

It is an object of the present invention to solve at least one of the above problems.

In order to achieve the object, an exposure apparatus which exposes a substrate to a pattern due to an original comprises a substrate stage which holds and moves the substrate, and a first measurement unit which is arranged on the substrate stage, and measures a position of a mark formed on the original by projecting and receiving light.

In the present invention, a device manufacturing method comprises a step of exposing a substrate to a pattern due to an original using the aforementioned exposure apparatus.

In the present invention, a stage apparatus comprises a first stage which holds and moves a first object, a second stage which holds and moves a second object, and a first measurement unit which is arranged on the second stage, and measures a position of a mark formed on the first object by projecting and receiving light.

In the present invention, an alignment method of a first object and a second object, which is applied to a stage apparatus including a first stage which holds and moves the first object, and a second stage which holds and moves the second object comprises steps of a first measurement of measuring a position of a mark formed on the first object by projecting and receiving light using a first measurement unit arranged on the second stage, and moving the first stage based on a measurement result in said first measurement step.

Other objects and advantages besides those discussed above shall be apparent to those skilled in the art from the description of a preferred embodiment of the invention which follows. In the description, reference is made to accompanying drawings, which form apart thereof, and which illustrate an example of the invention. Such example, however, is not exhaustive of the various embodiments of the invention, and therefore reference is made to the claims which follow the description for determining the scope of the invention.

DETAILED DESCRIPTION OF THE PREFERRED EMBODIMENT

An embodiment of the present invention will be described below in detail with reference to the accompanying drawings.

Figure 1:
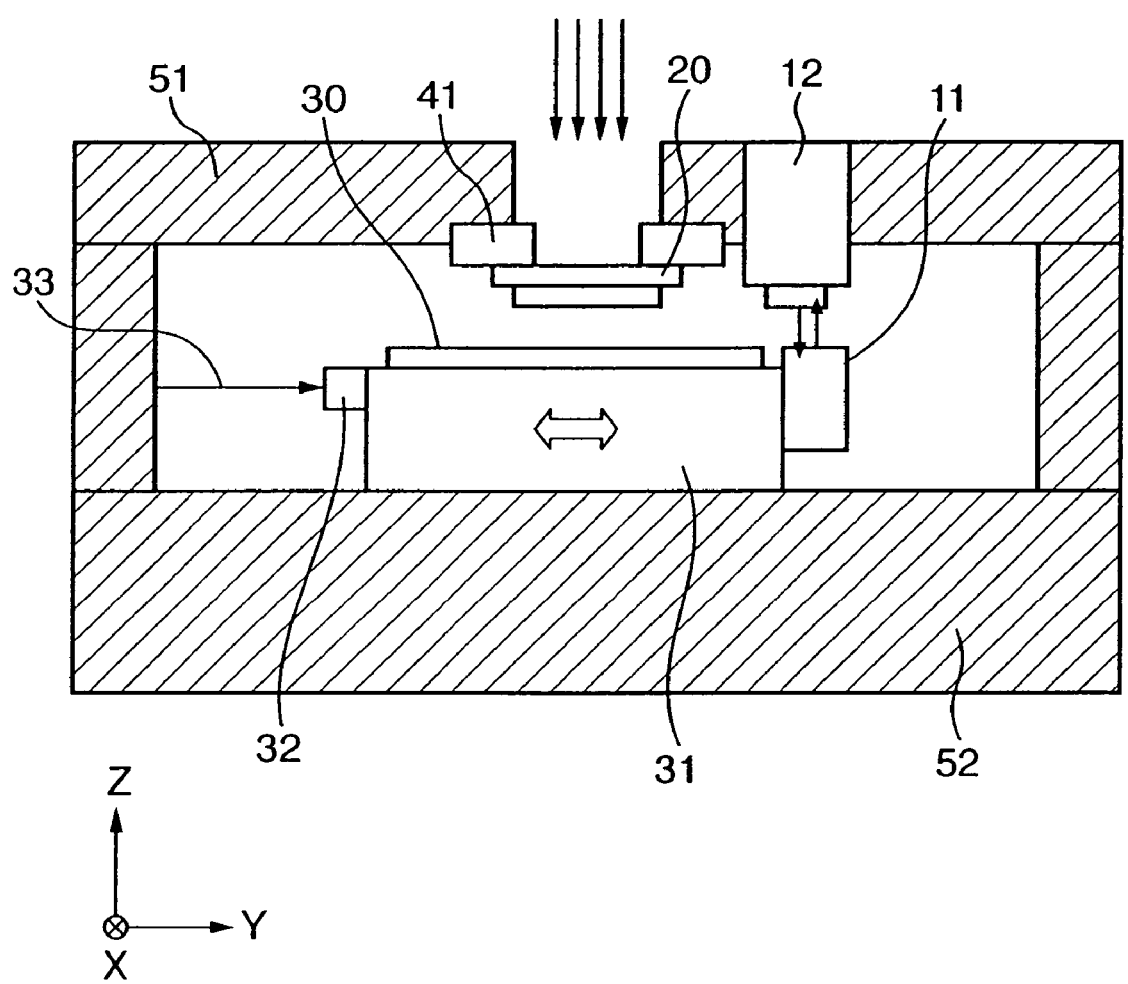
FIG. 1 is a view showing arrangements of the alignment portion and wafer stage portion of a mask and wafer arranged in a proximity X-ray exposure apparatus according to an embodiment of the present invention.

FIG. 1 is a view showing arrangements of the alignment portion and wafer stage portion of a mask and wafer arranged in a proximity X-ray exposure apparatus according to an embodiment of the present invention.

In FIG. 1, reference numeral 11 denotes a mask alignment scope which performs mask alignment; 12, an off-axis scope which measures a wafer position; 20, a mask on which a circuit pattern is drawn; 30, a wafer; 31, a wafer stage; 32, a mirror which reflects a laser interferometer beam; 33, a laser interferometer beam; 41, a mask stage which performs rotational position alignment of the mask; 51, a main body frame which supports an overall apparatus; and 52, a stage base having a reference surface on which the wafer stage 31 moves. In the above arrangement, an X-ray serving as exposure light is emitted downward through the mask 20, and the circuit pattern drawn on the mask 20 is transferred to an exposure surface of the wafer 30.

The mask stage 41 detachably holds the mask 20, maps the posture (rotational position) of the mask 20 to the coordinate system of the wafer stage 31, and is arranged on the main body frame 51. The off-axis scope 12 is fixed to the body frame 51, and the positions of the wafer alignment marks formed on the wafer 30 can be detected by driving the wafer stage 31. Then, on the basis of the detection results of the wafer alignment mark positions, the wafer stage 31 is driven step by step in order to be aligned for the mask 20, thereby performing sequential exposure.

The wafer stage 31 can move on the stage base 52 in the X and Y directions to expose the entire exposure surface of the wafer 30. In the mask alignment, the wafer stage 31 moves the mask alignment scopes 11 to the respective positions of the mask alignment marks formed on the mask 20 to measure the mask alignment mark positions.

Since the wafer stage 31 is required to be aligned at very high precision, the position is controlled on the basis of the positional measurement result obtained by the laser interferometer. The laser interferometer irradiates the bar-shaped mirrors 32 formed on two outer surfaces of the wafer stage 31 with the laser interferometer beams 33, and detects the stage position by measuring the reflection beams from the mirrors 32. The two mask alignment scopes 11 are mounted on the wafer stage 31 to measure the positions in the X and Y directions.

Figure 2A:
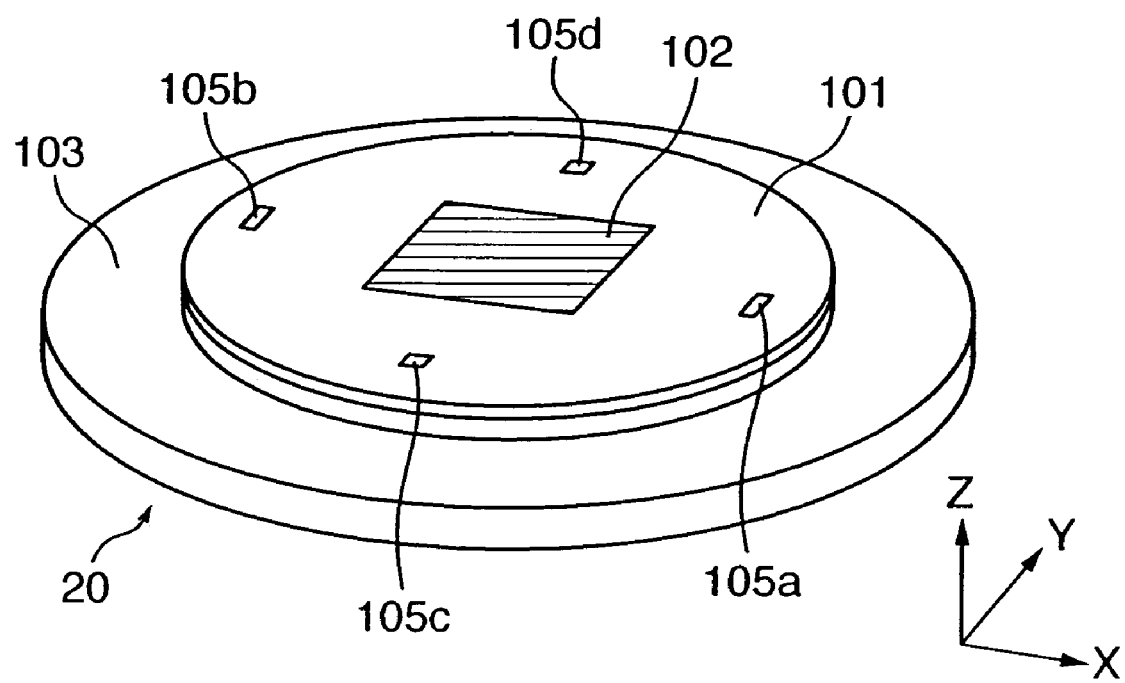
FIG. 2A is a perspective view showing the arrangement of the mask.
Figure 2B:
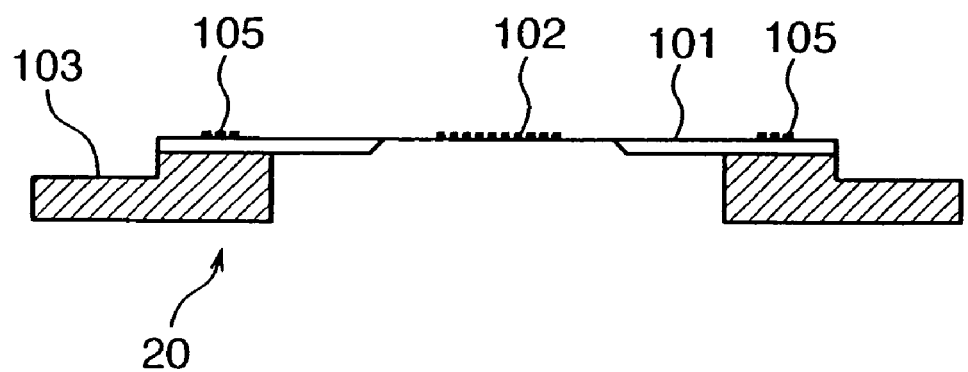
FIG. 2B is a sectional view showing the arrangement of the mask.

FIG. 2A is a perspective view showing the arrangement of the mask 20, and FIG. 2B is a sectional view showing the arrangement of the mask 20.

In FIGS. 2A and 2B, the mask 20 is arranged such that a mask substrate 101 having a membrane 102 on which the circuit pattern is drawn is brought into tight contact with a mask frame 103. Note that in FIG. 2B, the mask substrate 101 is formed above the mask frame 103. However, the mask substrate 101 is formed under the mask frame 103 in the exposure apparatus.

On the mask substrate 101, mask alignment marks 105*a*, 105*b*, 105*c*, and 105*d* serving as positional references for aligning the rotational position of the mask 20 are arranged at four positions. The mask alignment marks 105*a* and 105*b* are marks for measuring positions in Y direction, and the mask alignment marks 105*c* and 105*d* are marks for measuring positions in X direction. The mask alignment marks 105 need not be arranged on the membrane 102, but can be arranged anywhere on the surface of the substrate. The rotational position of the mask is measured at two positions in the X and Y directions, and detected by calculating the difference between the two positions. Therefore, the mask alignment marks are preferably arranged as apart as possible.

Figure 3:
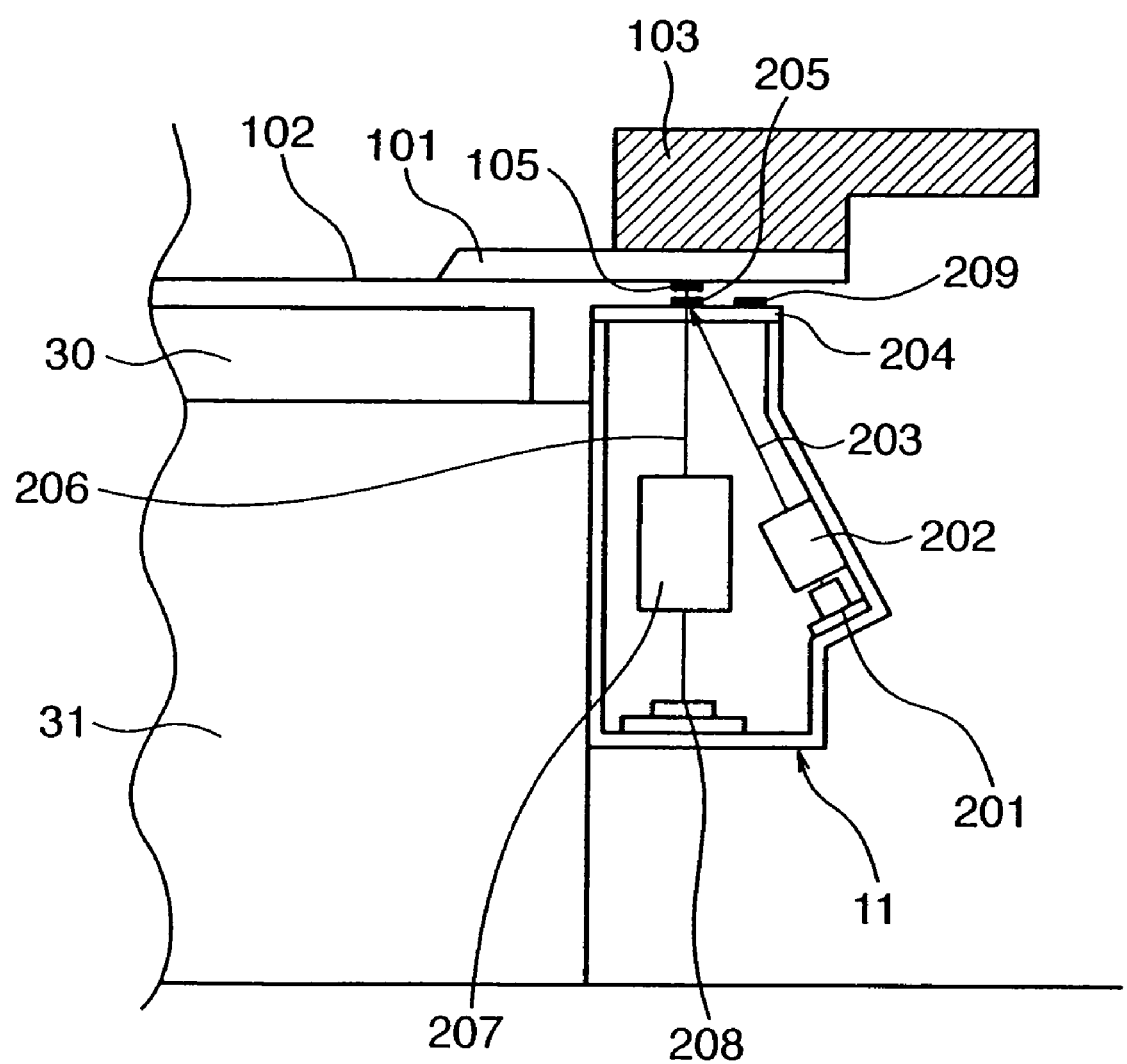
FIG. 3 is a sectional view showing an alignment scope in detail.

FIG. 3 is a sectional view showing a detail of an alignment scope 11. The same reference numerals in FIG. 3 denote the same elements as in FIG. 1 and FIGS. 2A and 2B.

In FIG. 3, the mask alignment scope 11 is fixed on the outer side surface of the wafer stage 31. Reference numeral 201 denotes a laser diode of the alignment light source; 202, an illumination optical system which shapes a beam emitted from the laser diode; 203, a projection beam; 204, a plane glass for transferring the beam; 205, a grating lens mark formed on the plane glass 204; 206, a reception beam with alignment information; 207, a light-receiving optical system for projecting the reception beam on a two-dimensional sensor; 208, the two-dimensional sensor such as CCD which converts the alignment information into an electrical signal; and 209, a reference mark which corrects a base line of the off-axis scope.

The mask alignment mark 105 formed on the mask and the grating lens mark 205 formed on the scope are formed by Fresnel lenses. The information of the relative positions of two marks can be obtained as a spot position for focusing light on the two-dimensional sensor. The position of the mask alignment mark relative to the mask alignment scope is calculated by a central processing unit from image information obtained by the two-dimensional sensor 208. The position in the wafer coordinate system of the mask alignment mark 105 can be obtained by the coordinates of the wafer stage 31 and an alignment measurement value obtained by the laser interferometer.

Figure 4:
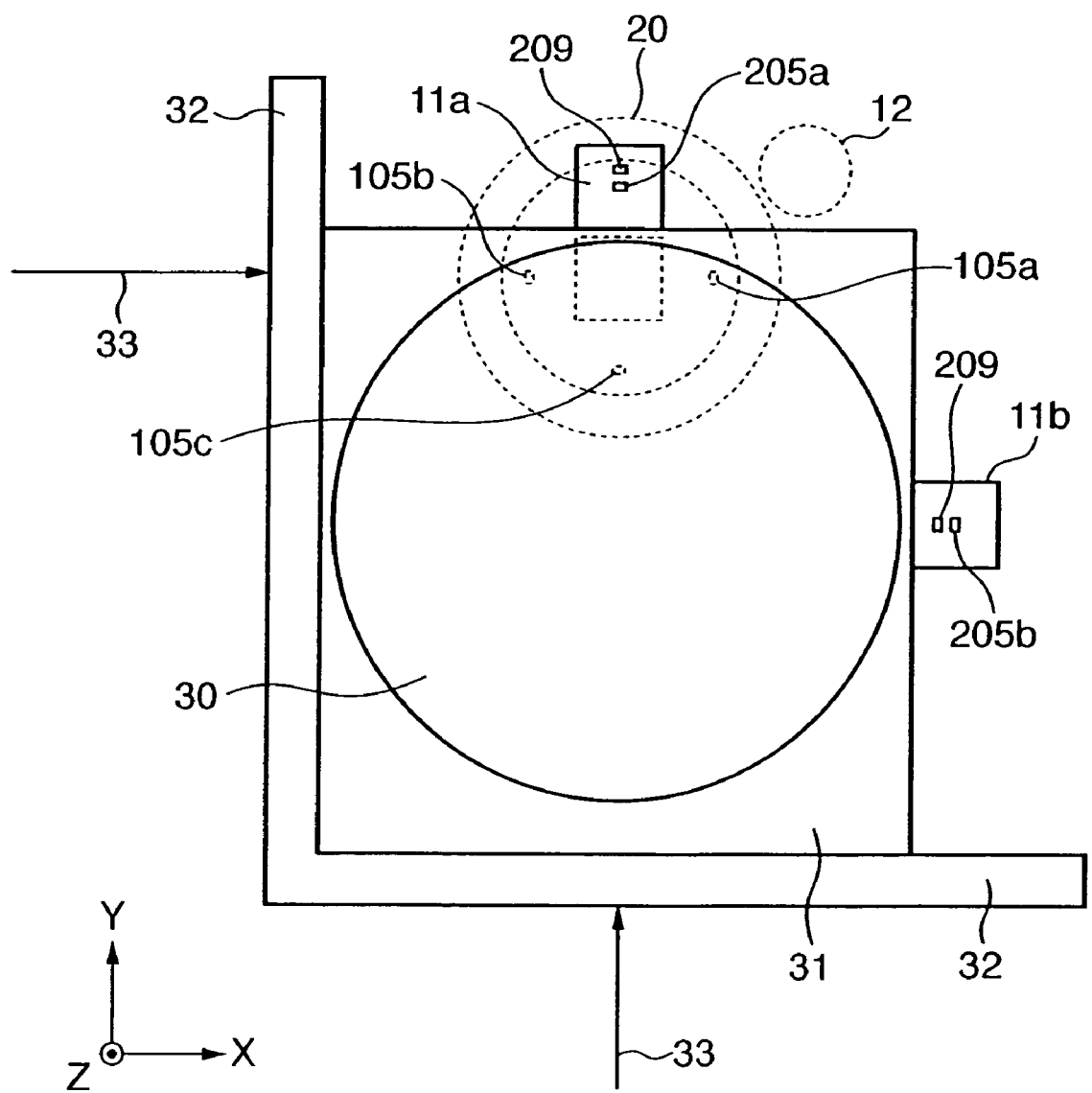
FIG. 4 is a view showing a positional relationship among the wafer stage, the mask, and an off-axis scope.

FIG. 4 shows a positional relationship among the wafer stage, the mask, and an off-axis scope. Reference numeral 11*a* denotes a mask alignment scope for X-position measurement; and 11*b*, a mask alignment scope for Y-position measurement. The mask alignment scopes 11*a* and 11*b* are attached on the two outer side surfaces of the wafer stage 31. The dotted line represents the mask which is arranged at almost the center of the apparatus. The laser interferometer measures the position of the wafer stage 31 by receiving the laser interferometer beams 33 emitted to the center of the apparatus in the X and Y directions.

The wafer stage 31 shown in FIG. 4 moves the mask alignment scope 11*a* to the position of the mask alignment mark 205*a*, and measures the position. The reference marks 209 for correcting the base line are formed on the respective alignment scopes. When correcting the base line, the wafer stage 31 is moved to the position of the off-axis scope 12, the reference mark positions are measured by off-axis scope 12 to detect the reference mark positions. Additionally, the position of the wafer stage 31 is measured by the coordinates obtained by the laser interferometer to calculate the base line value on the basis of these two values.

Figure 5A:
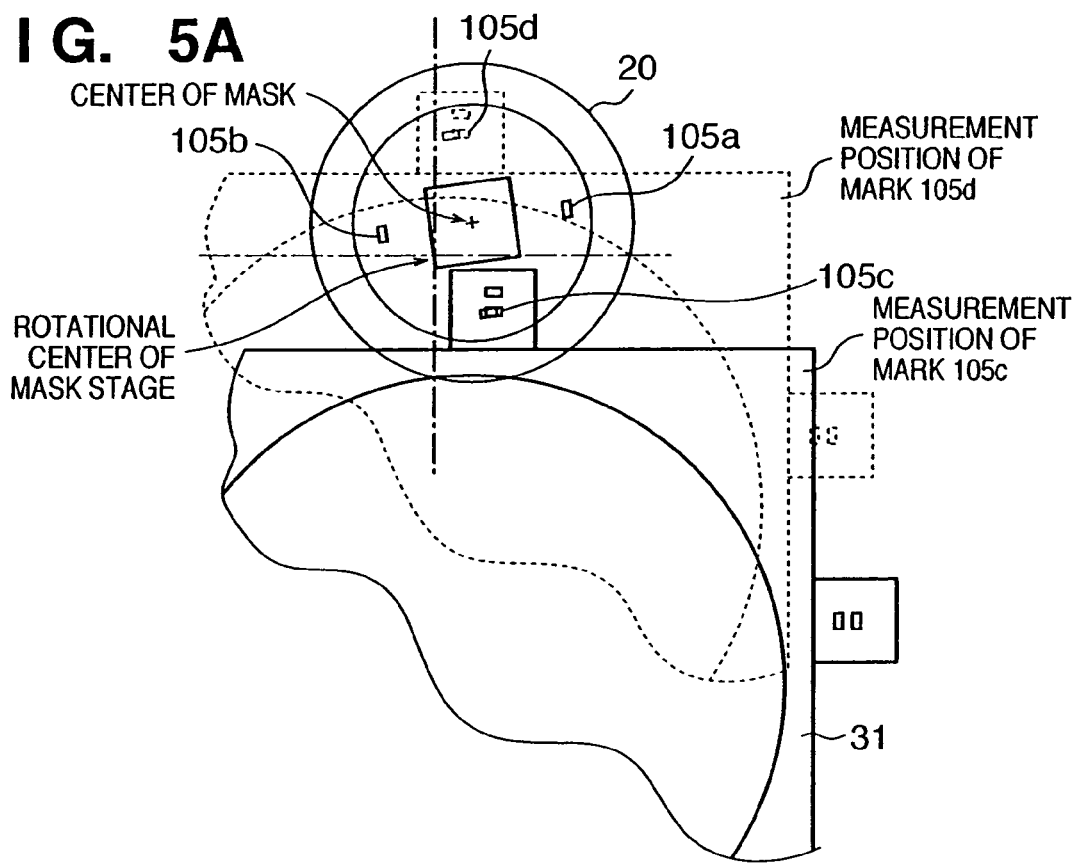
FIGS. 5A and 5B are views for explaining a mask alignment according to the embodiment of the present invention.

With reference to FIG. 5, a mask alignment operation will be described below. In FIG. 5A, the alignment marks 105*c* and 105*d* in the X direction are measured after loading the mask to the apparatus. The rotational center of the mask stage is adjusted to the coordinates of the center of the wafer stage and the center of the optical path of the exposure light in assembling the apparatus. The chain line and solid line represent the measurement positions of the mask alignment mark 105*d* and the mask alignment mark 105*c* to which the wafer stage 31 moves, respectively. The positional measurement in the Y direction is also performed as in the X direction. The wafer stage 31 moves to the mark positions in measuring the respective four marks. On the basis of the measurement results of the four marks, the mask coordinates and the rotational position for the coordinate system of the wafer stage are calculated. On the basis of these results, the mask stage is rotated to map the rotational position of the mask to the coordinate system of the wafer stage. By repeating the above mark measurement and driving of the mask stage, the alignment is performed until the mask rotational position falls within the allowable value for the wafer stage coordinate system. Every time the mask stage rotates, the mark coordinates change, thereby changing the measurement position of the wafer stage in accordance with the mark movement.

Figure 5B:
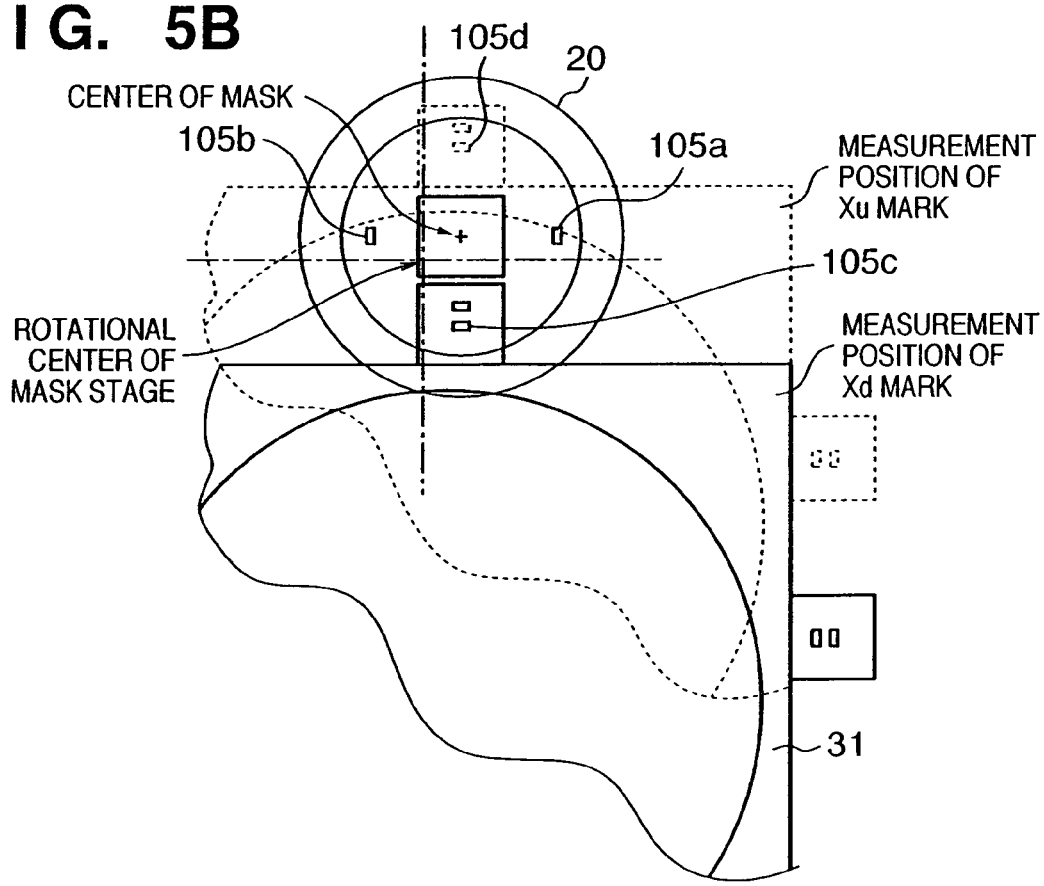

FIG. 5B shows a result of the mark rotational position mapped to the wafer stage coordinate system. The mask is aligned only in the rotational direction, because when overlay exposure is performed by a global alignment which is generally used, the rotational component of each exposure shot cannot be removed, and the rotational position needs to be aligned in advance. The shift amounts of the mask in the X and Y directions are reflected to the alignment of the wafer stage in the wafer alignment, and the alignment of a masking blade (not shown) for defining the exposure view angle.

In the conventional mark measurement system, in order to move the mask alignment scopes to the respective mask alignment mark positions, the 2-axis stages dedicated to the mask alignment scopes are required. In the above arrangement, the wafer stage whose position is controlled by the laser interferometer also serves as an alignment means of the mask alignment scopes. Therefore, high-precision scope alignment can be performed. In the conventional method, the reference marks formed on the wafer stage need to move to the respective mask alignment mark positions as well as the mask alignment scope. However, in the apparatus according to the embodiment, the grating lens mark corresponding to the reference mark is integrated with the mask alignment scope. Hence, the reproducibility of the positions of the mask alignment mark and mask alignment scope is much improved. Therefore, the reproducibility of the mark measurement is improved. Additionally, since the mask alignment scope can be arranged close to the mask alignment mark, the mask alignment scope optical system can be made small and simple, thereby reducing the cost of the apparatus.

The wafer is aligned by the off-axis scope 12 mounted on the apparatus. That is, the off-axis scope 12 is used for sensing and processing the images of the alignment marks, and detecting these positions. Since the position (position of the off-axis scope 12) for measuring the wafer position and the position (position of the mask) for actually exposing the wafer do not match each other, the relative position (base line) of the exposure position and the alignment measurement position needs to be known. Note that since the base line always varies by the influence of the thermal expansion or the like of the apparatus, and the variation is not negligible for overlay accuracy at 10 nm level. This requires frequent base line measurements.

In order to measure the base line, the mask alignment scope 11 moves to the position of the off-axis scope 12, and the positions of the off-axis scope 12 and the mask alignment marks on the wafer stage coordinate system are detected by measuring the positions of the reference marks 209 on the plane glass by the off-axis scope 12, and measuring the mask alignment marks by the mask alignment scope 11. As a result, the base line value can be obtained.

Figure 6:
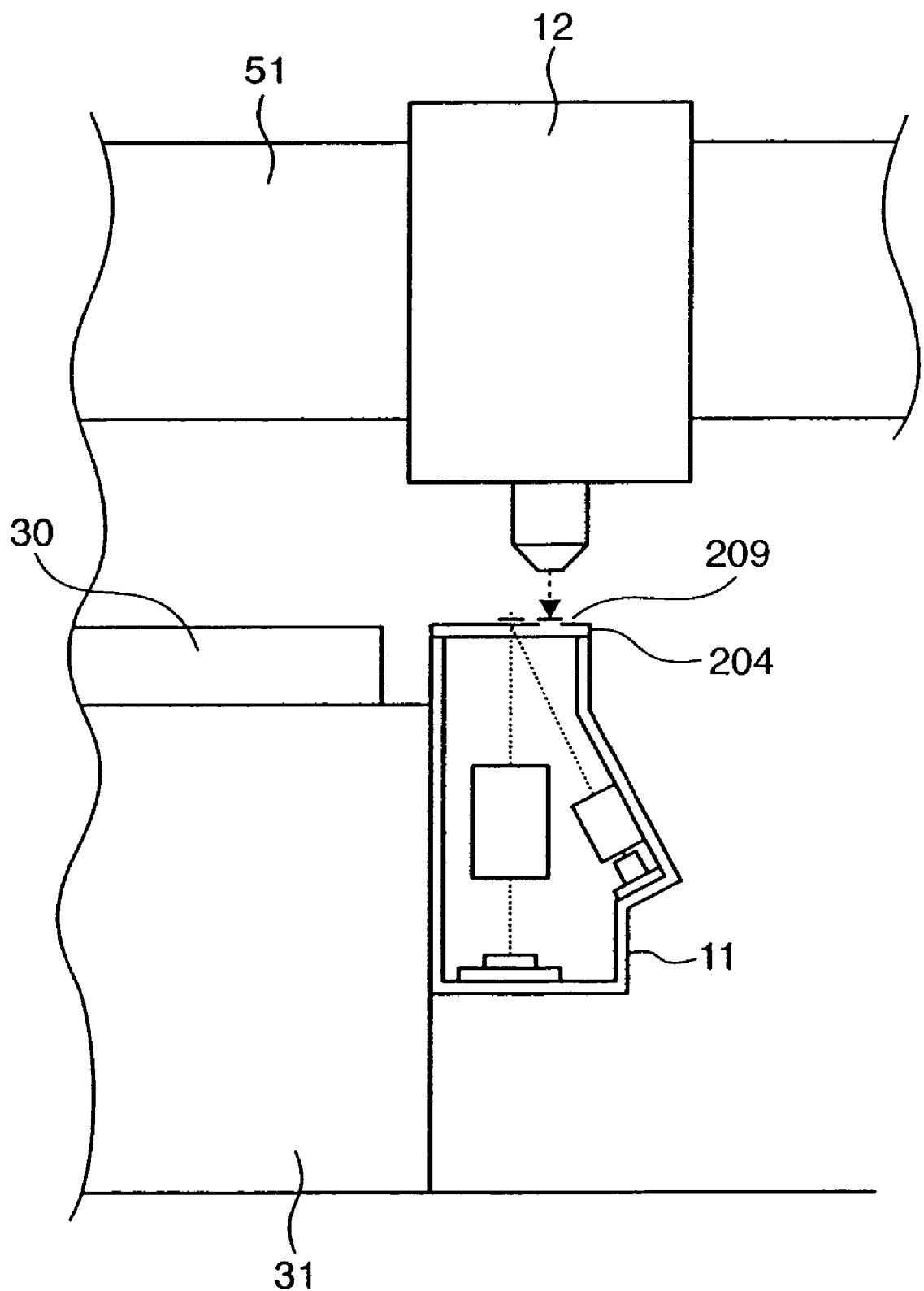
FIG. 6 is a view for explaining base line correction according to the present invention.
Figure 7:
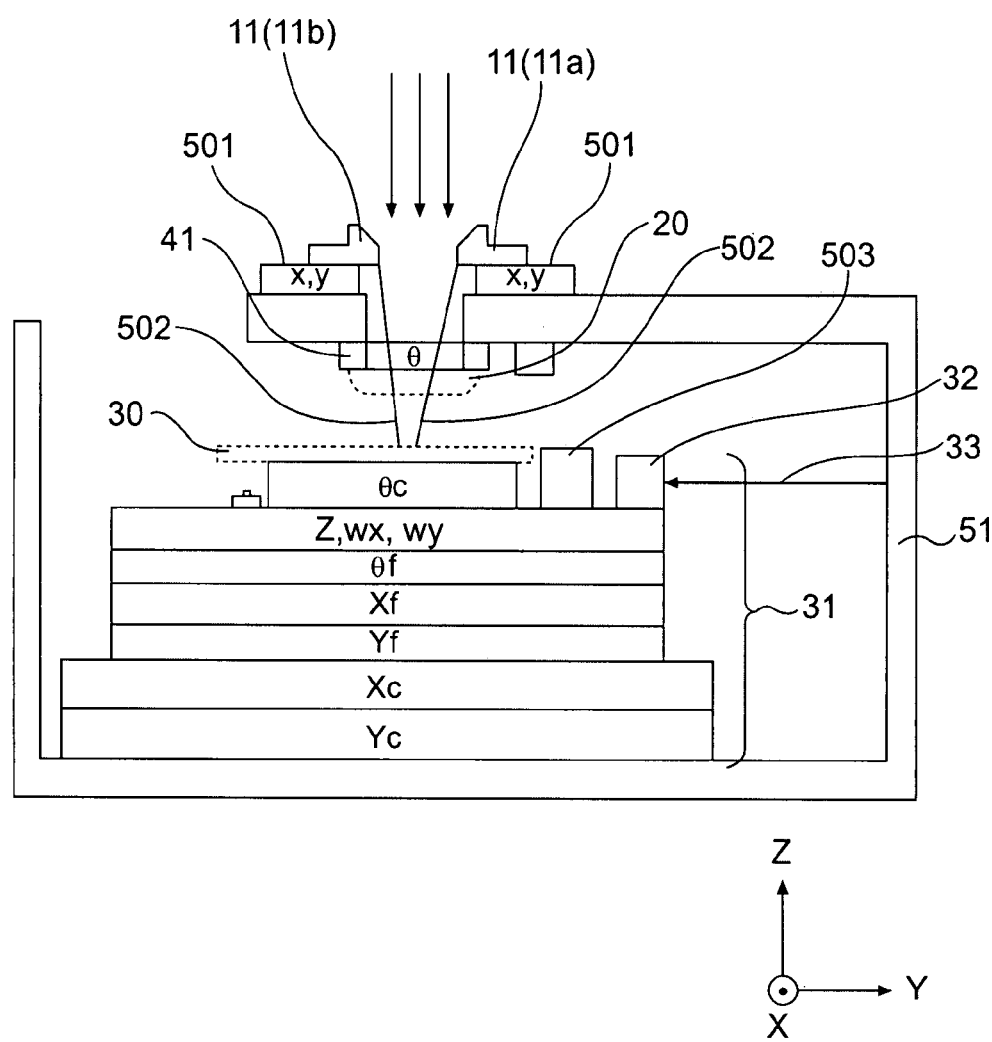
FIG. 7 is a view showing the arrangement of a conventional apparatus.
Figure 8:
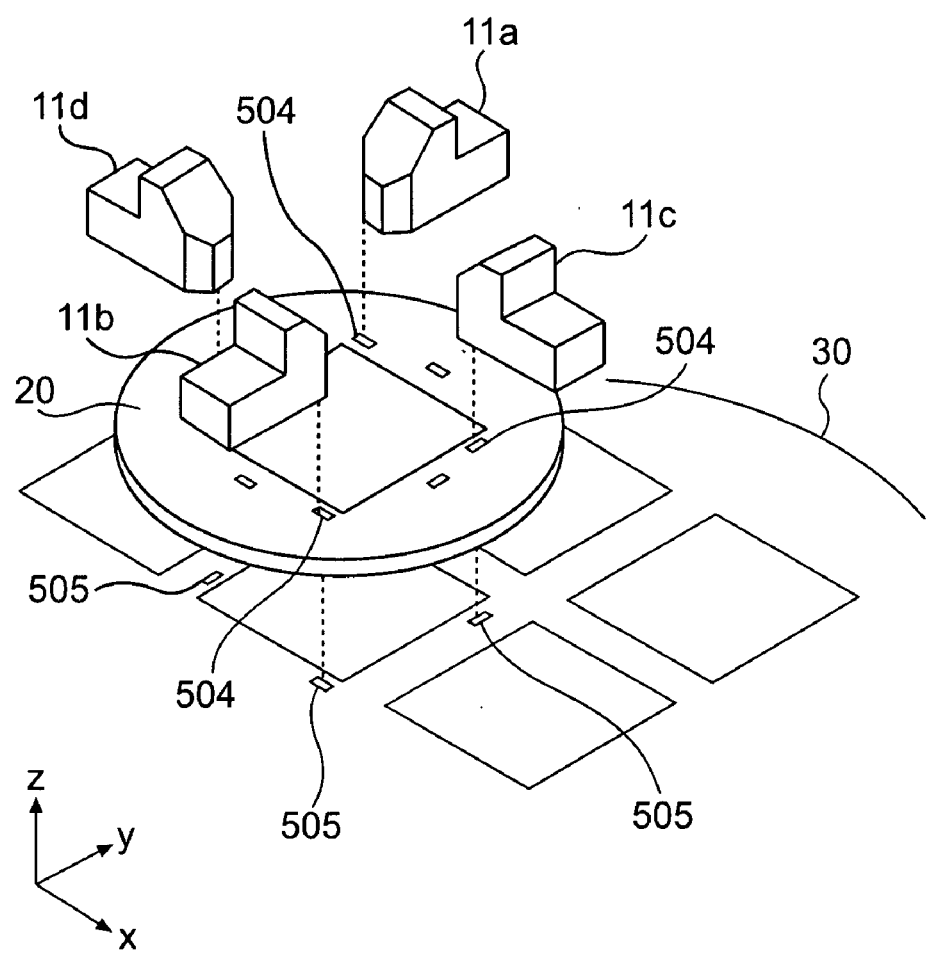
FIG. 8 is a view showing the arrangement of a conventional alignment portion.
Figure 9A:
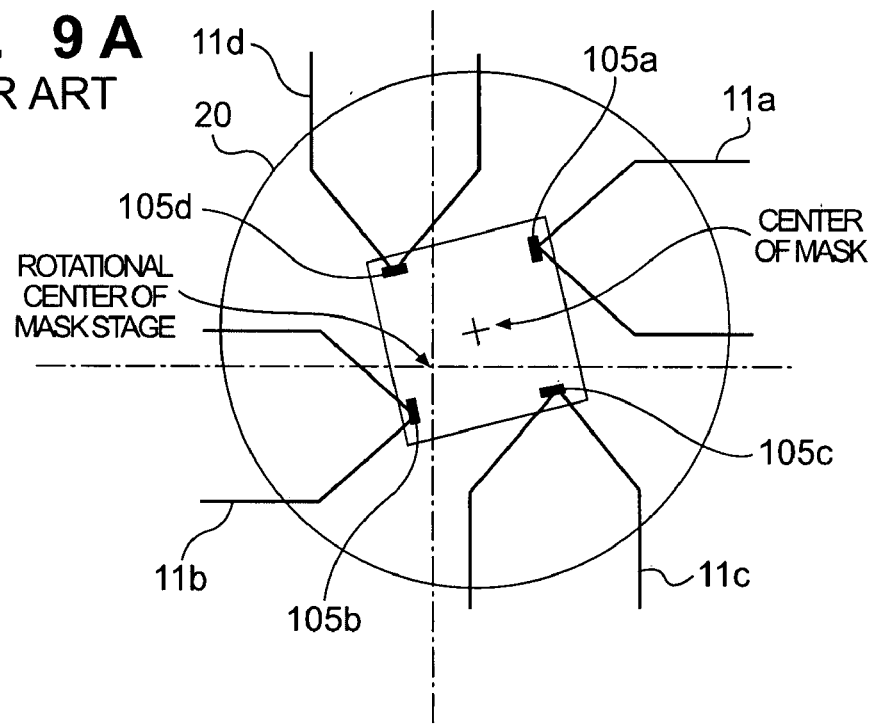
FIGS. 9A and 9B are views for explaining conventional mask alignment.
Figure 9B:
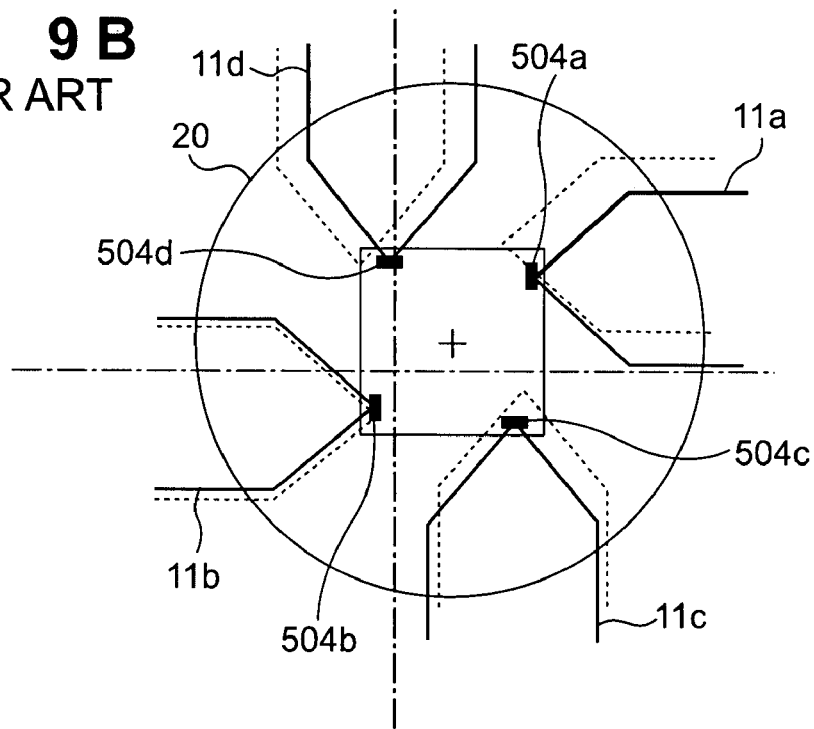

In FIG. 6, the off-axis scope 12 measures the reference mark 209. Actually, the off-axis scope 12 measures the reference mark 209 in both the X and Y directions.

In the above description, the method of mounting the mask alignment scope on the wafer stage to perform the mask alignment, and the method of correcting the base line have been described.

In the above embodiment, the mask alignment scopes are mounted for measuring the positions in the X and Y directions. However, one mask alignment scope may be mounted for measuring the positions in both the X and Y directions. Also, the present invention is not limited to the X-ray exposure method. The present invention can be applied to another exposure method in which a master and target substrate are adjacently arranged.

The present invention is not limited to the exposure apparatus in which the mask (master) and the wafer (substrate) are moved. The present invention can be applied to various apparatuses such as a processing apparatus and measurement apparatus when such an apparatus includes a stage apparatus which relatively moves and aligns a plurality of objects.

In the above embodiment, the mask alignment marks need not always be formed on the mask membrane, and can be formed around the mask membrane. Hence, the distance between the marks for calculating the mask rotational position becomes large, thereby increasing the precision of the detection of the mask alignment rotational position. Furthermore, since the mask alignment scope is integrated with the reference mark (grating lens mark) of the wafer coordinate system, the 2-axis stage for aligning the mask alignment scope with the reference mark of the wafer coordinate system need not be used. As a result, the measurement error caused by the reproducibility error for aligning the scope and mask alignment mark which is generated in aligning with a scope without the reference mark of the wafer coordinate system is eliminated, thereby increasing the measurement precision.

Since the 2-axis stage for aligning the mask alignment scope is not needed, the cost of the apparatus is reduced. Also, since only two mask alignment scopes are required, the cost of the apparatus is further reduced. Also, since the mask alignment scopes need not be arranged close to the mask, the arrangement becomes simple, thereby increasing the maintenance.

In the above arrangement, a high-precision exposure apparatus can be provided at lower cost, and high-performance semiconductor device can be manufactured at lower cost.

<Method of Manufacturing Semiconductor Device>

Figure 10:
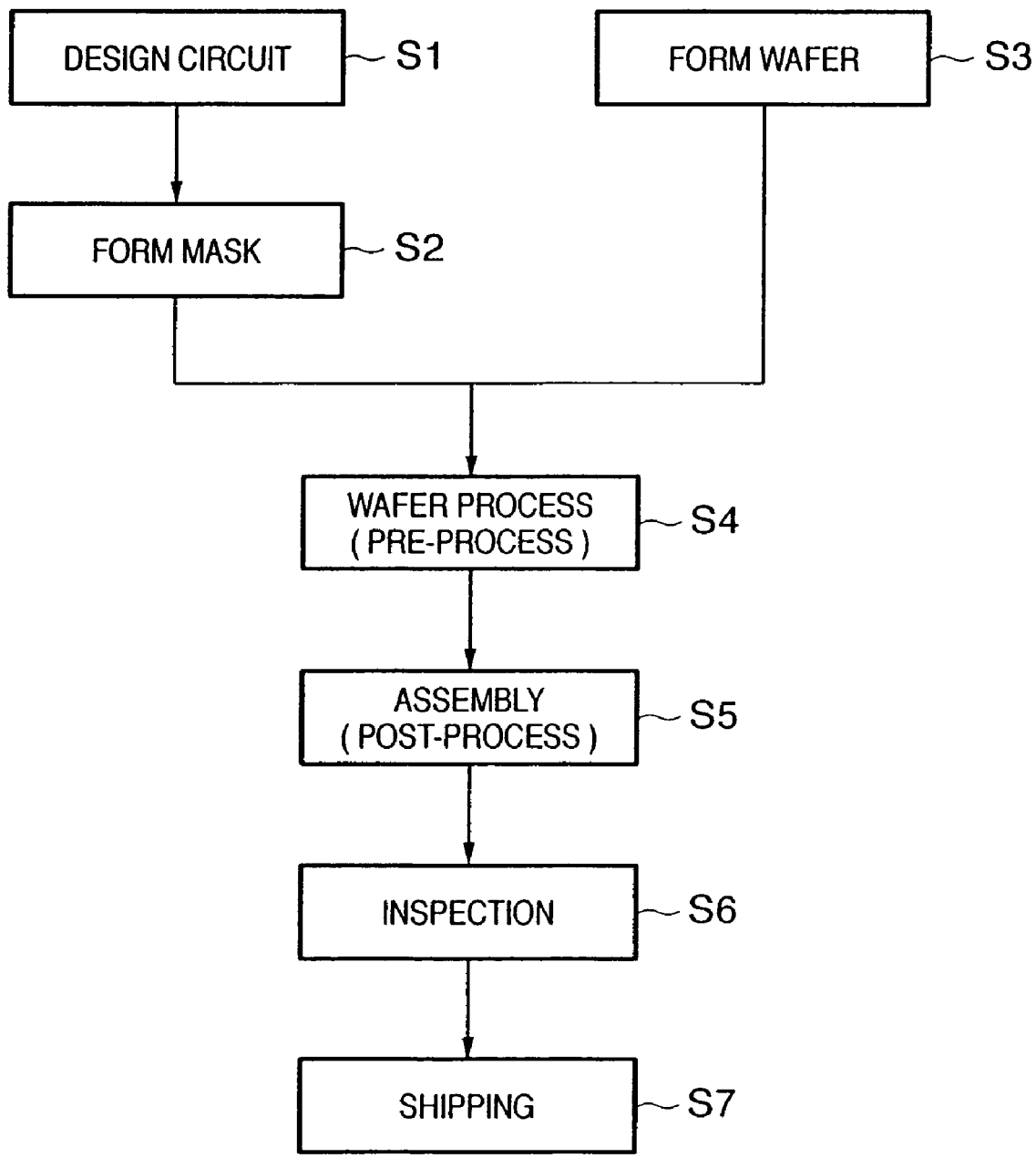
FIG. 10 is a flowchart for explaining a manufacturing process of a device in the exposure apparatus according to the embodiment.

A semiconductor device manufacturing process using the above-described exposure apparatus will be explained. FIG. 10 shows the flow of the whole manufacturing process of a semiconductor device. In step S1 (circuit design), a semiconductor device circuit is designed. In step S2 (mask formation), a mask having the designed circuit pattern is formed. In step S3 (wafer formation), a wafer is formed by using a material such as silicon. In step S4 (wafer process) called a pre-process, an actual circuit is formed on the wafer by lithography using the prepared mask and wafer. Step S5 (assembly) called a post-process is the step of forming a semiconductor chip by using the wafer formed in step S4, and includes an assembly process (dicing and bonding) and packaging process (chip encapsulation). In step S6 (inspection), the semiconductor device manufactured in step S205 undergoes inspections such as an operation confirmation test and durability test. After these steps, the semiconductor device is completed and shipped (step S7).

Figure 11:
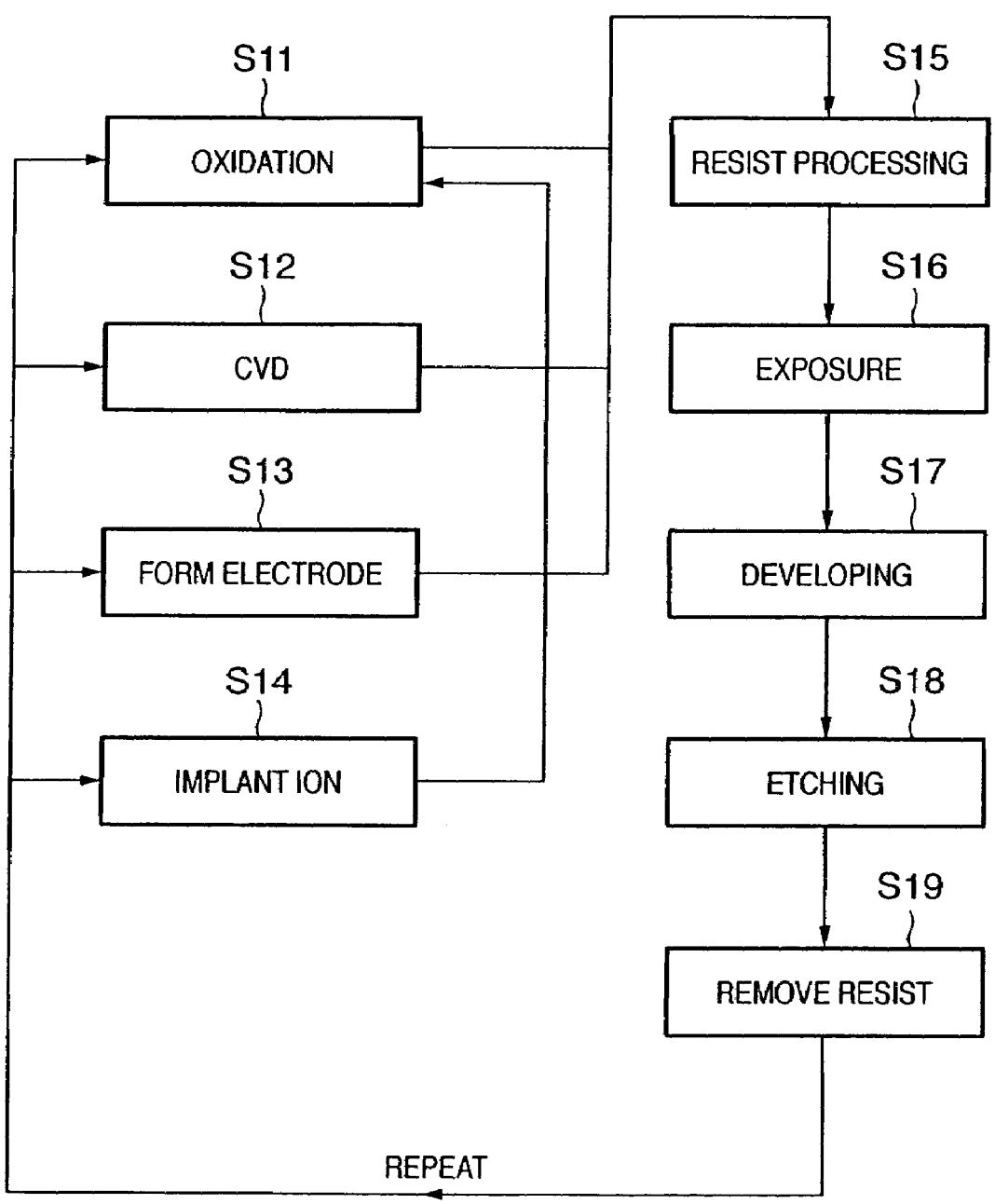
FIG. 11 is a view for explaining the wafer process of the exposure apparatus according to the embodiment.

FIG. 11 shows the detailed flow of the wafer process. In step S11 (oxidation), the wafer surface is oxidized. In step S12 (CVD), an insulating film is formed on the wafer surface. In step S13 (electrode formation), an electrode is formed on the wafer by vapor deposition. In step S14 (ion implantation), ions are implanted in the wafer. In step S15 (resist processing), a photosensitive agent is applied to the wafer. In step S16 (exposure), the above-mentioned X-ray exposure apparatus exposes the wafer to the circuit pattern of a mask, and prints the circuit pattern on the wafer. In step S17 (developing), the exposed wafer is developed. In step S18 (etching), the resist is etched except for the developed resist image. In step S19 (resist removal), an unnecessary resist after etching is removed. These steps are repeated to form multiple circuit patterns on the wafer.

A high-density semiconductor device which was difficult to be manufactured in the conventional technique can be manufactured at low cost by using the device manufacturing method according to the embodiment.

The present invention is not limited to the above embodiments and various changes and modifications can be made within the spirit and scope of the present invention. Therefore, to apprise the public of the scope of the present invention the following claims are made.

What is claimed is:

1. An apparatus for transferring a pattern of a master to a substrate, said apparatus comprising:
   a frame;
   a master stage arranged on said frame and configured to hold the master;
   a substrate stage configured to hold the substrate and to be moved relative to said frame;
   a first alignment scope arranged on said substrate stage and configured to measure a position of a master alignment mark formed on the master;
   a reference mark integrated with said first alignment scope; and
   a second alignment scope arranged on said frame and configured to measure a position of a substrate alignment mark formed on the substrate and a position of the reference mark,
   wherein a base line of said second alignment scope is obtained from measuring a position of the reference mark, moved with said substrate stage, by said second alignment scope and measuring a position of the master alignment mark by said first alignment scope moved with said substrate stage.

2. A method of manufacturing a device, said method comprising steps of:
   transferring a pattern of a master to a substrate by using an apparatus as defined in claim 1; and
   processing the wafer, to which the pattern has been transferred, to manufacture the device, said processing step including a step of etching the wafer.

* * * * *

UNITED STATES PATENT AND TRADEMARK OFFICE
CERTIFICATE OF CORRECTION

PATENT NO. : 7,248,335 B2
APPLICATION NO. : 11/377282
DATED : July 24, 2007
INVENTOR(S) : Kazuyuki Kasumi It is certified that error appears in the above-identified patent and that said Letters Patent is hereby corrected as shown below:

COLUMN 8:
Line 52, "Sll" should read -- S11 --.

Signed and Sealed this

Eighteenth Day of March, 2008

JON W. DUDAS
*Director of the United States Patent and Trademark Office*